United States Patent [19]

Furukawa et al.

[11] Patent Number: 4,990,994
[45] Date of Patent: Feb. 5, 1991

[54] ELECTRODE STRUCTURE FOR SILICON CARBIDE SEMICONDUCTORS

[75] Inventors: Katsuki Furukawa, Sakai; Akira Suzuki, Nara; Mitsuhiro Shigeta, Nara; Atsuko Uemoto, Nara, all of Japan

[73] Assignee: Sharp Kabushiki Kaisha, Osaka, Japan

[21] Appl. No.: 403,016

[22] Filed: Sep. 5, 1989

Related U.S. Application Data

[63] Continuation of Ser. No. 208,847, Jun. 14, 1988, abandoned, and a continuation-in-part of Ser. No. 910,482, Sep. 23, 1986, abandoned.

[30] Foreign Application Priority Data

Sep. 24, 1985 [JP] Japan .................. 60-211661

[51] Int. Cl.⁵ .................. H01L 23/54; H01L 23/48
[52] U.S. Cl. .................. 357/67; 357/80
[58] Field of Search .................. 357/81, 80, 67, 74

[56] References Cited

U.S. PATENT DOCUMENTS

| 4,352,120 | 9/1982 | Kurihara et al. | 357/65 |
| 4,561,010 | 12/1985 | Ogihara et al. | 357/74 |
| 4,571,610 | 2/1986 | Matsushita et al. | 357/67 |

FOREIGN PATENT DOCUMENTS

DE-AS1106 of 0000 Fed. Rep. of Germany.
2028076 2/1978 Fed. Rep. of Germany.

OTHER PUBLICATIONS

Sequeda, The Role of Thin Film Materials on the Technology of Integrated Circuit Fabrication-Journal of Metals-Nov. 1985.
Hilborn et al., Proceedings of the 3rd Annual Conf. on Si'C, 1968, pp. 337-339.
Nishino et al., Appl. Phys. Lett., 42(5), 1983, pp. 460–462.
Liaw et al., J. Electrochem. Soc. Solid State Science & Tech., 1985, pp. 642-648.

*Primary Examiner*—Rolf Hille
*Assistant Examiner*—S. V. Clark
*Attorney, Agent, or Firm*—Bryan, Cave, McPheeters & McRoberts

[57] ABSTRACT

An electrode structure for a silicon carbide single-crystal semiconductor in which the surface of the silicon carbide single-crystal is laminated with a metal layer of titanium, aluminum, chromium or molybdenum, or with the metal layer and an electrically conductive protective layer formed over the metal layer to provide an ohmic electrode.

5 Claims, 2 Drawing Sheets

ELECTRODE STRUCTURE FOR SILICON CARBIDE SEMICONDUCTORS

This is a continuation of U.S. application Ser. No. 208,847, filed June 14, 1988; and U.S. application Ser. No. 910,482, filed Sept. 23, 1986, and now abandoned.

BACKGROUND OF THE INVENTION

1. Field of the Invention

The present invention relates to an electrode structure for silicon carbide (SiC) semiconductors. More particularly, the invention relates to an ohmic electrode structure for SiC semiconductor devices useful as devices operable at high temperatures, devices for use with great electric power, radiation-resistant devices, photoelectric conversion devices, etc.

2. Description of the Prior Art

Many crystal structures are present for SiC, which has forbidden band widths of 2.2 to 3.3 eV depending on the crystal structure. Further SiC is very stable thermally, chemically and mechanically, and can be of p-type and n-type both with high stability, which is rarely the case with wide-gap semiconductors. Accordingly, semiconductor devices comprising an SiC single crystal which is provided with an electrode for electrical connection to external circuits will find wide use in various fields of electronic techniques as devices operable at high temperatures, devices for use with great electric power, radiation-resistant devices, photoelectric conversion devices, etc.

Conventionally, the electrode to be formed on SiC semiconductors is prepared from nickel (Ni) for n-type SiC or from eutectic crystal of aluminum (Al) and silicon (Si) for p-type SiC, by depositing the material on SiC by vacuum evaporation and converting the deposited film to an alloy in contact with SiC at a high temperature of about 1100° C. ("Breakdown Field in Vapor-Grown Silicon Carbide P-N Junctions," Journal of Applied Physics, Vol. 48, No. 11, pp. 4831-4833 (1977)).

When an electrode is to be formed on SiC semiconductors in this way, the electrode film deposited requires heat treatment at a high temperature of about 1100° C. to form an alloy, whereas the electrode metal undergoes agglomeration during the conversion, making it difficult to afford a uniform ohmic electrode. Furthermore, the agglomeration of the electrode metal stresses the SiC single crystal in contact therewith to result in lower crystallinity due to the distortion of the crystal, increased dislocation, etc. This impairs the electrical contact between the SiC single crystal and the electrode and further entails troubles such as separation of the electrode from the SiC semiconductor when the device has a large area, thus posing the problem that the semiconductor device fails to retain the desired reliability.

On the other hand, as far as we are aware, no report has been made on an electrode formed by depositing Ti, Al or the like on an SiC semiconductor by vacuum evaporation. Further, it has been speculated that in view of the properties to be exhibited by Ti, Al or the like on Si, such element will provide a schottky contact to act as a schottky electrode (SEMICONDUCTORS HANDBOOK, revised edition, pp. 315-317, printed by OHM Corporation, Japan (1984)).

Under the foregoing situation, we have conducted extensive research and found that when Ti, Al or the like is deposited on an SiC semiconductor by vacuum evaporation, a compact film can be formed with excellent adhesion and denseness. Moreover, we have unexpectedly found that the film functions as an ohmic electrode.

SUMMARY OF THE INVENTION

Accordingly, the present invention provides an electrode structure for silicon carbide single-crystal semiconductor in which the surface of the silicon carbide single-crystal is laminated with a metal layer of titanium, aluminum, chromium or molybdenum, or the metal layer and an electrically conductive protective layer over the metal layer to provide an ohmic electrode.

DESCRIPTION OF THE PREFERRED EMBODIMENTS

Figure 1:
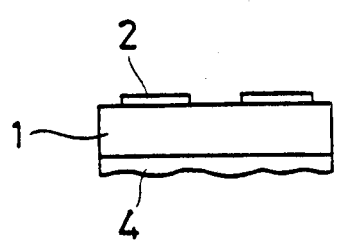
FIG. 1 is a diagram showing an embodiment of electrode structure of the present invention for a silicone carbide semiconductor.

The SiC single crystal to be used in the present invention is usually one formed on an Si single crystal substrate by crystal growth. The process for crystal growth is not limited specifically. However, we have found that one epitaxially grown by the chemical vapor deposition process (CVD process) is an SiC single crystal of with the cubic structure ($\beta$ type) which is desirable for the object of the present invention. A. Suzuki et al., Journal of Crystal Growth, 70(1984), 287-290 disclosed a CVD process which is usable for the present invention and in which and SiC single crystal is grown in two divided stages, i.e., in a low-temperature range (800°-1200° C.) and - a high-temperature range (1200°-1400° C.).

The SiC single crystal may be either n-type or p-type and may be made to have the structure of a semiconductor operative device, such as field-effect transistor, by being doped with n-type and p-type impurities. From the viewpoint of adhesion to Ti, Al or the like, the SiC single crystal preferably has minute surface irregularities (minute indentations or projections). When the crystal does not have such surface irregularities, for example, because it is formed by crystal growth, it is desirable to render the crystal rough-surfaced, for example, by irradiation with an ion beam using argon gas or by plasma etching.

The metal layer to be formed on the surface of the SiC single crystal is a layer of titanium, aluminum, chromium or molybdenum. Of these, a titanium or aluminum layer is preferable. Preferably, the metal layer is prepared from a metal powder or piece by vacuum evaporation, i.e., by evaporating the metal material by resistance heating or with an electron beam, although the layer can be formed by sputtering. Known means is usable for this purpose. The degree of vacuum to be employed is preferably up to $10^{-6}$ torr. Thus, the metal layer is formed by depositing a metal on the surface of the SiC single crystal. It is suitable that the metal layer be 200 to 800 angstroms in thickness. The electrode can be prepared in the form of a pattern usually by etching the metal layer obtained by vacuum evaporation or using a mask for evaporation. The metal layer formed by vacuum evaporation has good adhesion to the SiC single crystal and a very compact structure, and is therefore connectable as it is to an external wiring as by brazing. Thus, an ohmic electrode structure is available.

Nevertheless, if the metal layer is thin, it is generally desirable to form an electrically conductive protective layer over the metal layer. Examples of useful protective materials are Al, Cu, Ni and the like. Especially when the metal layer is a Ti layer, an Al protective layer is preferred. Like the metal layer, the protective layer can be formed by vacuum evaporation with resistance heating or an electron beam. It is suitable that the protective layer have a thickness of 1000 to 3000 angstroms. The protective layer may comprise two layers. The protective layer thus provided assures reliability against external impact and the like.

The ohmic electrode of the present invention is useful for SiC semiconductors and gives improved reliability to SiC semiconductor devices for actual use in various electronic apparatus and systems. Since the electrode of the present invention can be prepared without the high-temperature heat treatment conventionally needed, semiconductor devices can be produced easily with a reduced likelihood of deterioration.

EXAMPLE 1

A substrate of Si single crystal (2 inches in diameter) was heated to 1050° C., and monosilane ($SiH_4$) and propane ($C_3H_8$) as the source gases were introduced to the substrate at flow rates of 2.2 c.c./min and 0.4 c.c./min, respectively, for 1 minute, as entrained in hydrogen ($H_2$) gas serving as a carrier gas and supplied at a flow rate of 3 liters/min, whereby an SiC polycrystalline layer having a thickness of about 250 angstroms was formed on the substrate. Subsequently, the supply of source gases was discontinued without interrupting the flow of hydrogen gas, and the Si substrate was heated to 1350° C. $SiH_4$ and $C_3H_8$ were thereafter introduced at flow rates of 0.04 c.c./min and 0.02 c.c./min, respectively, for 2 hours to grow a thin film of $\beta$-type SiC single crystal, 2.5 $\mu$m in thickness, over the Si substrate formed with the very thin SiC polycrystalline layer.

Next, Ti was deposited on the entire surface of the SiC single-crystal film by vacuum evaporation with resistance heating, using finely divided Ti. The degree of vacuum was about $1 \times 10^{-6}$ torr, and the Ti layer formed had a thickness of about 500 angstroms. A Ti electrode was then formed in the shape of a pattern by etching the Ti layer with hydrofluoric acid (HF) using photolithography (see FIG. 1). In the drawing, indicated at 1 is the SiC single crystal, at 2 the Ti layer and at 4 the Si single-crystal substrate.

The Ti layer 2 formed by vacuum evaporation firmly adhered to the underlying SiC single crystal and was very compact. Accordingly, the Ti layer 2 can be immediately wired for connection to an external circuit to serve as an ohmic-contact electrode structure.

Figure 3:
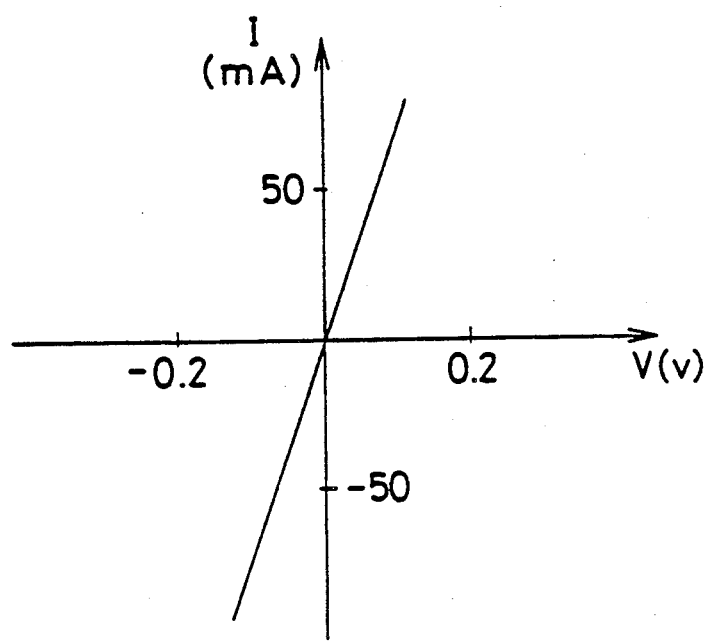
FIG. 3 is a graph showing the current-voltage characteristics exhibited by the electrode structure of Example 1.

To substantiate that the Ti electrode is an ohmic contact, an SiC single crystal (indicated at 1 in FIG. 1) and a Ti layer were formed on the front and rear surfaces of an Si single-crystal substrate, respectively, in the same manner as above, and the product was checked for the current-voltage characteristics. FIG. 3 shows the result. FIG. 3 reveals that the current value varies linearly with the variation of the voltage, while the resistance involved is low. This indicates that the Ti layer effectively functions as an ohmic electrode.

EXAMPLE 2

Figure 2:
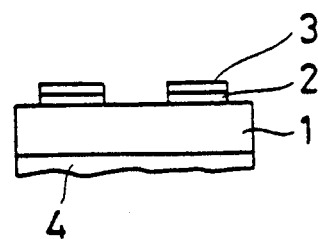
FIG. 2 is a diagram showing another embodiment.

With reference to FIG. 2, a Ti layer 2 was grown on an SiC single crystal 1 by vacuum evaporation in the same manner as in Example 1. Subsequently, an Al layer 3 was formed over the Ti layer 2 similarly by vacuum evaporation with resistance heating. The degree of vacuum was about $1 \times 10^{-6}$ torr, and the Ti layer 2 and the Al layer 3 were about 300 angstroms and about 1000 angstroms, respectively, in thickness. In this way, an electrode of Ti-Al two-layer structure was formed on the SiC single crystal.

With the electrode structure of the present example, the Ti layer 2 is firmly bonded to the underlying SiC single crystal 1 in intimate contact therewith to provide an ohmic contact, while the Al layer 3 provides a surface readily connectable to an external wiring. The two-layer electrode composed of the Ti layer 2 and the Al layer 3 therefore serves as a stable ohmic electrode for the SiC single crystal 1. The thick Al layer 3 protecting the electrode structure assures improved reliability against external impact or the like.

The Ti-Al electrode of the present example was checked for the current-voltage characteristics in the same manner as in Example 1. The result is similar to that shown in FIG. 3, indicating that the electrode is a satisfactory ohmic electrode.

EXAMPLE 3

Figure 4:
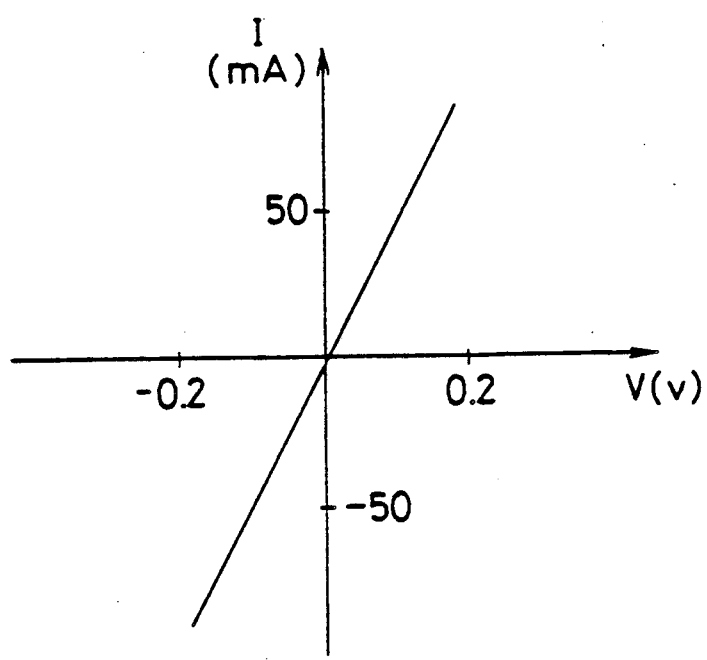
FIG. 4 is a graph showing the current-voltage characteristics exhibited by the electrode structure of Example 3.

In the same manner as in Example 1, an Al layer, about 2000 angstroms in thickness, was formed on an SiC single crystal by vacuum evaporation with resistance heating. The current-voltage characteristics of the electrode were determined in the same manner as in Example 1. The result is shown in FIG. 4, which reveals that the Al layer, although having slightly higher resistance, exhibits satisfactory ohmic characteristics and effectively functions as an ohmic electrode.

EXAMPLE 4

The same SiC single crystal as used in Example 1 and an SiC single crystal (5 mm × 5 mm) prepared by the sublimation process were irradiated over their surfaces with an ion beam (acceleration voltage 3 kV, emission current 20 mA) using argon gas to form approximately 300-angstrom indentations in the surfaces. A Ti layer was formed on the crystals in the same manner as in Example 1. The surface irregularities resulted in improved adhesion and higher reliability. The electrodes obtained exhibited the same current-voltage characteristics as those shown in FIG. 3 and were therefore found useful as ohmic electrodes.

What we claim is:

1. In an electrode structure for a silicon carbide single-crystal semiconductor in which the surface of the silicon carbide single-crystal is laminated with an electrode layer, the improvement in which the silicon carbide single-crystal has surface irregularities and the electrode layer comprises a metal layer of titanium, chromium or molybdenum and an electrically conductive protective layer of aluminum, copper and/or nickel formed thereon, to provide an ohmic electrode.

2. The electrode structure of claim 1, wherein the silicon carbide single-crystal is an epitaxially grown single crystal having a cubic structure of the $\beta$ type.

3. The electrode structure of claim 1, wherein the metal layer is from 200 to 800 Angstroms in thickness.

4. The electrode structure of claim 1, wherein the electrically conductive protective layer is from 1000 to 3000 Angstroms in thickness.

5. The electrode structure of claim 1, wherein the metal layer is from 200 to 800 Angstroms in thickness, and the electrically conductive protective layer is from 1000 to 3000 Angstroms in thickness.

* * * * *